United States Patent
Wen

(10) Patent No.: US 9,753,087 B2
(45) Date of Patent: Sep. 5, 2017

(54) METHOD FOR TESTING A MULTI-CHIP SYSTEM OR A SINGLE CHIP AND SYSTEM THEREOF

(75) Inventor: Gan Wen, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 163 days.

(21) Appl. No.: 14/384,172

(22) PCT Filed: May 10, 2012

(86) PCT No.: PCT/CN2012/075289
§ 371 (c)(1),
(2), (4) Date: Sep. 10, 2014

(87) PCT Pub. No.: WO2013/166685
PCT Pub. Date: Nov. 14, 2013

(65) Prior Publication Data
US 2015/0048855 A1    Feb. 19, 2015

(51) Int. Cl.
*G01R 31/26* (2014.01)
*G01R 31/319* (2006.01)
*G01R 31/3185* (2006.01)
*G01R 31/317* (2006.01)
*G01R 31/28* (2006.01)

(52) U.S. Cl.
CPC ....... *G01R 31/319* (2013.01); *G01R 31/2851* (2013.01); *G01R 31/31723* (2013.01); *G01R 31/318513* (2013.01)

(58) Field of Classification Search
None
See application file for complete search history.

(56) References Cited

U.S. PATENT DOCUMENTS

| | | | | |
|---|---|---|---|---|
| 5,872,793 A | * | 2/1999 | Attaway | G01R 31/31833 714/726 |
| 7,013,415 B1 | | 3/2006 | Kamei et al. | |
| 2003/0226072 A1 | | 12/2003 | Bruckman et al. | |
| 2005/0246599 A1 | * | 11/2005 | Simpson | G01R 31/31715 714/724 |
| 2005/0268185 A1 | * | 12/2005 | Vinke | G11C 29/32 714/718 |

(Continued)

FOREIGN PATENT DOCUMENTS

| | | |
|---|---|---|
| CN | 1667427 | 9/2005 |
| CN | 102338848 | 2/2012 |
| WO | WO 2006/053587 | 5/2006 |

OTHER PUBLICATIONS

Notification Concerning Transmittal of International Preliminary Report on Patentability (Chapter 1 of the Patent Cooperation Treaty) for International application No. PCT/CN2012/075289, Nov. 11, 2014.

(Continued)

*Primary Examiner* — Minh N Tang
(74) *Attorney, Agent, or Firm* — Baker Botts, LLP

(57) ABSTRACT

A method for testing a multi-chip system with multiple ports includes determining a test path formed by connecting the multiple ports. The test path is determined in such a way that the internal logic circuit of each chip in the multi-chip system is bypassed. The method further includes injecting a test traffic to the test path, and receiving the test traffic from the test path.

4 Claims, 7 Drawing Sheets

(56) References Cited

U.S. PATENT DOCUMENTS

2006/0156104 A1    7/2006  Chang et al.

OTHER PUBLICATIONS

Extended European Search Report for Application No. / Patent No. 12876402.4-1560 / 2748622 PCT/CN2012075289, Apr. 16, 2015.
International Search Report for International Application No. PCT/CN2012/075289, Feb. 28, 2013.

* cited by examiner

# METHOD FOR TESTING A MULTI-CHIP SYSTEM OR A SINGLE CHIP AND SYSTEM THEREOF

PRIORITY

This nonprovisional application is a U.S. National Stage Filing under 35 U.S.C. §371 of International Patent Application Ser. No. PCT/CN2012/075289, filed May 10, 2012 and entitled "Method for Testing a Multi-Chip System or a Single Chip and System Thereof."

TECHNICAL FIELD

The present invention relates generally to electronic product testing. More particularly, the present application relates to the technique of testing a multi-chip system or a chip.

BACKGROUND OF THE INVENTION

Generally, the test for an electrical system which includes one or more chips is comprised of the hardware and software tests. The hardware test involves testing of hardware connectivity, interface protocol, signal integrity, Electro Magnetic Compatibility (EMC)/Electron-Magnetic Interference (EMI) etc. The software test involves testing of functionality of the system.

It is desired that the hardware test can be conducted as early as possible such that the software can run on a reliable hardware upon being installed or loaded into the electrical system. However, in order to run the test signal through the interface of the electrical system according to the conventional test techniques, certain software functions, such as the function of booting up the system and driver for chip(s) of the system, have to be prepared in the system and some software tests, such as the driver test, have to be done. As relying on the software of the system to a large extent, the hardware test can not be conducted at an earlier period of development of the system and can not be conducted in case of any question in the software.

SUMMARY OF THE INVENTION

According to one aspect of the present invention, there is provided a method for testing a multi-chip system including multiple ports. The method can comprise determining a test path formed by connecting the multiple ports, in which the test path is determined in such a way that an internal logic circuit of each chip in the multi-chip system is bypassed, injecting a test traffic to the test path, and receiving the test traffic from the test path.

According to another aspect of the present invention, there is provided a system for testing a multi-chip system including multiple ports. The system can comprise a test path determining module and a test traffic generator. The test path determining module can be configured to determine a test path formed by connecting the multiple ports, the test path being determined in such a way that an internal logic circuit of each chip in the multi-chip system is bypassed. The test traffic generator can be configured to generate a test traffic, transmit the test traffic to the test path, and receive the test traffic from the test path.

According to another aspect of the present invention, there is provided a method for testing a chip including multiple ports. The method comprises determining a test path formed by connecting the multiple ports, in which the test path can be determined in such a way that an internal logic circuit of each chip in the chip is bypassed, injecting a test traffic to the test path, and receiving the test traffic from the test path.

According to yet another aspect of the present invention, there is provided a system for testing a chip including multiple ports. The system can comprise a test path determining module and a test traffic generator. The test path determining module can be configured to determine a test path formed by connecting the multiple ports of the chip, the test path being determined in such a way that an internal logic circuit of the chip is bypassed. The test traffic generator can be configured to generate a test traffic, transmit the test traffic to the test path, and receive the test traffic from the test path.

According to yet another aspect of the present invention, there is provided a chip with multiple ports. Each of the multiple ports can be configured to work in one of a normal mode, near end loopback mode, and bypass mode when the chip is under test. The normal mode can refer to a working mode where a port receives a test traffic from outside of the chip and then injects it to a test chain located in the chip; and receives the test traffic from the test chain and then transmits it to the outside of the chip. The near end loopback mode can refer to a working mode where a port receives a test traffic from the test chain, and then loops it back to the test chain. The bypass mode can refer to a working mode where a port receives a test traffic from the outside of the chip, and then loops it back to the outside of the chip, and the test traffic on the test chain in the chip including said port bypasses said port. The test chain can be used to connect the multiple ports of the chip and to bypass the internal logic of the chip.

According to still another aspect of the invention, a multi-chip system comprising two or more chips, where the chip is the one as above mentioned.

The internal logic circuit of each chip in the multi-chip system is bypassed by the test path, and thereby enabling the test traffic transmits throughout the test path without entering the internal logic circuit.

DETAILED DESCRIPTION

The present application now will be described more fully with reference to the accompany drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "comprises", "includes" and/or "comprising", "including", when used in this specification, specify the presence of stated features, steps, operations, elements, and/or components, but do not preclude the presence or addition of one or more other features, steps, operations, elements, components, and/or groups thereof.

It will be understood that, although the terms first, second, etc. may be used here to describe various elements, components, regions, layers and/or sections, these elements, components, regions, layers and/or sections should not be limited by these terms. These terms are only used to distinguish one element, component, region, layer or section discussed below could be termed a second element, component, region, layer or section without departing from the teachings of the present invention.

The multi-chip system herein refer to a system including more than one integrated circuit chip coupled each other to perform some function. Each chip of the multichip system comprises at least one port used to receive and/or transmit signal.

Figure 1:
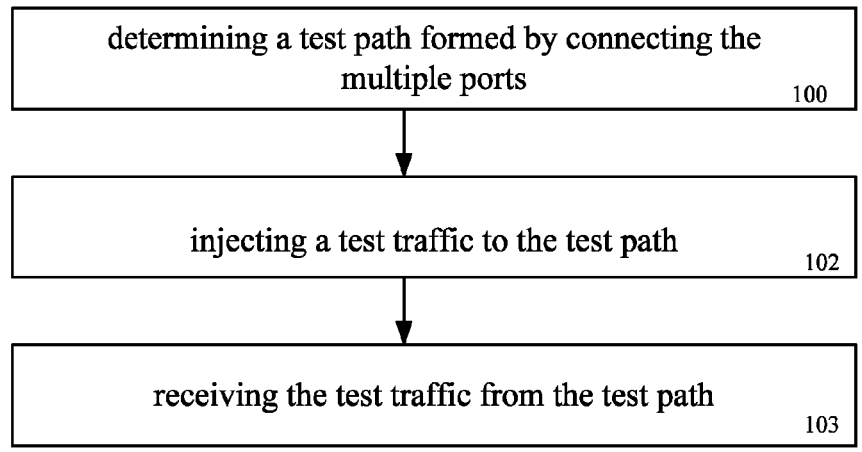
FIG. 1 is a flow chart of a method for testing a multi-chip system according to an embodiment of the present invention, in which the multi-chip system comprises multiple ports.

FIG. 1 is a flow chart of a method for testing a multi-chip system according to an embodiment of the present invention, in which the multi-chip system comprises multiple ports. According to the method, a test path can be determined (step 100) by forming the test path via connecting the multiple ports, where the test path is determined in such a way that the internal logic circuit of each chip in the multi-chip system is bypassed. A test traffic is then injected (step 102) to the test path. Further, the test traffic is received (step 103) after it transmitted throughout the test path.

The multiple ports of the multi-chip system, which are provided at chips of the multi-chip system, include two or more ports. The multi-chip ports are classified into external port, used to connect the multi-chip system to other system which can be a device or an element, and internal port used to interconnect the chips of the multi-chip system.

Figure 2:
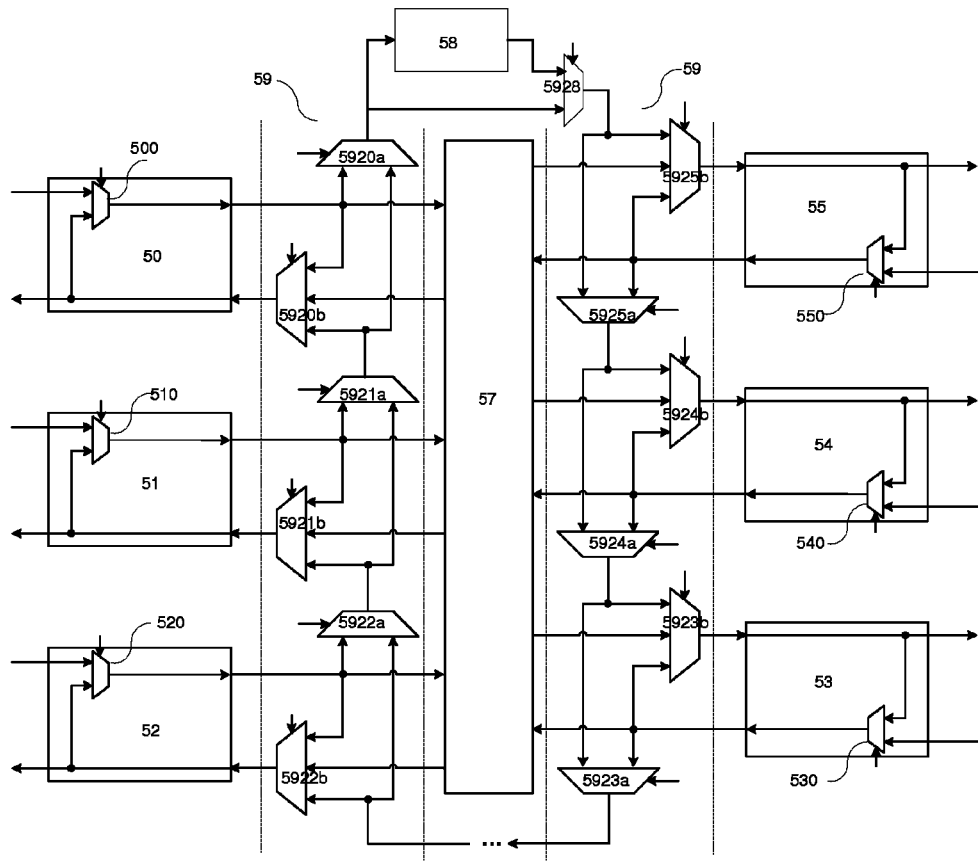
FIG. 2 illustrates an internal structure of a chip with six ports.

We now will discuss an illustratively internal structure of a chip according to an embodiment of the present invention with reference to FIG. 2, illustrating an internal structure of a chip with six ports, before further setting forth the method shown in FIG. 1. For clarity, FIG. 2 only shows a part of the internal structure of the chip relating to the solution of the present invention. As shown, the chip 5 includes ports 50, 51, 52, 53, 54, and 55, the internal logic circuit 57, and the test chain 59. The internal logic circuit 57, which is illustratively simplified to be a block for the purpose of clarity, can perform some function in combination with for example software and/or firmware. The test chain 59 is provided between the ports 50, 51, 52, 53, 54, and 55 and the internal logic circuit 57 to bypass the internal logic circuit 57 when the chip is under test. Each port of the chip 5 is electrically connected to the test chain 59 to form the test path which is located in the chip. As shown, the ports 50, 51, 52, 53, 54, and 55 are provided with mode selecting elements 500, 510, 520, 530, 540, and 550, respectively, and the test chain 59 is provided with a plurality of mode selecting elements 5920a, 5920b, 5921a, 5921b, 5922a, 5922b, 5923a, 5923b, 5924a, 5924b, 5925a, and 5925b. As the co-work of the mode selecting element provided with each of ports and the mode selecting elements provided with the test chain corresponding to the respective port, the port can work in various modes when the chip is under test. For example, the mode selecting element 510 is provided with the port 51 and the mode selecting elements 5921a and 5921b are provided with the test chain 59 corresponding to the port 50. When the chip is under test, the port 51 can be configured to work in one of normal mode, near end loopback mode, and bypass mode (which will be described hereinafter) by the co-work of the mode selecting elements 510, 5921a, and 5921b.

Optionally, a built-in test traffic generator 58 can be provided in the chip 5 and electrically connected to the test chain 59. A mode selecting element 5928 is provided between the built-in test traffic generator 58 and the test chain 59 to enable or disable built-in test traffic generator 58. If the chip is under test, the built-in test traffic generator 58 can generate test traffic to transmit through the test path for the chip when it is enabled.

As discussed with reference to FIG. 2, the test path for the chip according an embodiment of the present invention is formed by connecting the ports of the chip through the test chain which can bypass the internal logic circuit. However, it shall be appreciated that the test path in this embodiment is located only in the chip. According to other embodiment, the test path can include an additional part located outside the chip. The additional part can be a series of cables each coupled to a port at the chip. The cable herein could be any electrical conductor, such as RJ45 cable for Ethernet port.

Returning to the method shown in FIG. 1, the test path for each chip of the multi-chip system is formed as above, and the test path for the multi-chip system is formed by electrically interconnecting the multiple chips of said system. The transmission of the test traffic along the test path is determined when the working mode are set for each port when the multi-chip system is under test.

For clarity, we will refer to a port which is an external port as an external port, and refer to a port which is an internal port as an internal port hereinafter. Any external port of the multi-chip system through which the test traffic is injected to that system is set as a normal mode, and the other external port(s) can be set as a near end loopback mode in certain embodiment or can be set as the normal mode in another embodiment. For an internal port at a chip of the multi-chip system, if said internal port is the port through which the test traffic is first transmitted to said chip, it is set as the normal mode. For an internal port at a first chip via which the first chip is connected to a second chip of the multi-chip system, said internal port is set as the normal mode if the first chip experiences the test traffic earlier than the second chip, or said internal port is set as a bypass mode if the first chip experiences the test traffic later than the second chip and at the same time said internal port is not that internal port through which the test traffic is first transmitted to the first chip. It is noted that the term "first chip" and "second chip" herein are not used to limit the chips of the multi-chip system but used to illustratively indicate any two chips of the multi-chip system which are interconnected each other.

The normal mode herein refers to a working mode where a port at a chip under the test environment receives a test traffic from outside of the chip and then injects the received test traffic to the test chain; and receives the test traffic from the test chain and then transmits the received test traffic to the outside of the chip. As above described, the test chain locates in the chip and bypasses the internal logic circuit of the chip. The near end loopback mode herein refers to a working mode where a port at a chip under the test environment receives a test traffic from the test chain and then loops the received test traffic back to the test chain. The bypass mode herein refers to a working mode where a port at a chip under the test environment receives a test traffic from outside of the chip and then loops the received test traffic back to the outside of the chip besides the test traffic on the test chain in the chip directly bypasses the port. When the chip is under test, each port can only be set as one of the normal mode, near end loopback mode, and bypass mode. The chip can be either any chip of the multi-chip system in the embodiments or examples relating to the multi-chip system or can be a separate chip in the embodiments or examples only relating to a single chip test.

Figure 3:
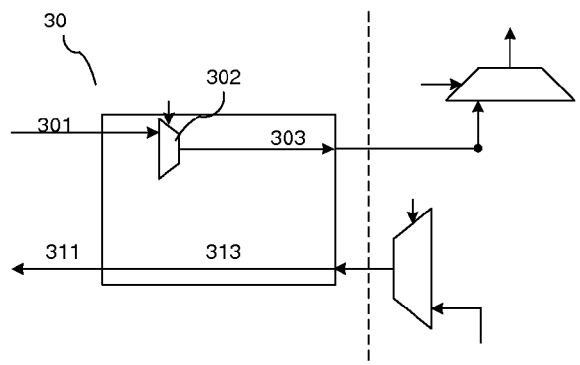
FIG. 3 illustrates a port in the normal mode.

FIG. 3 illustrates a port in the normal mode. As illustrated, the port 30 can receive the test traffic from outside of the chip such as an external test traffic generator via a connection 301 and then inject the received test traffic to the test chain (only part of the test chain is shown in FIG. 3) of the chip via a connection 303. A mode selection element 302 can be provided in the port between the connection 301 and the connection 303. Further, the port 30 can receive the test traffic from the test chain and then transmits the received test traffic to the outside of the chip via a connection 313. An element (not shown), which can be a device (such as the external test traffic generator) or a cable, can be used to receives the test traffic via a connection 311 transmitted from the port. It can be understood that the port is shown for the purpose of illustrative not limiting. The connections 301, 303, 313, 311 and the mode selection element 302 can be formed in the chip during the fabrication thereof.

Figure 4:
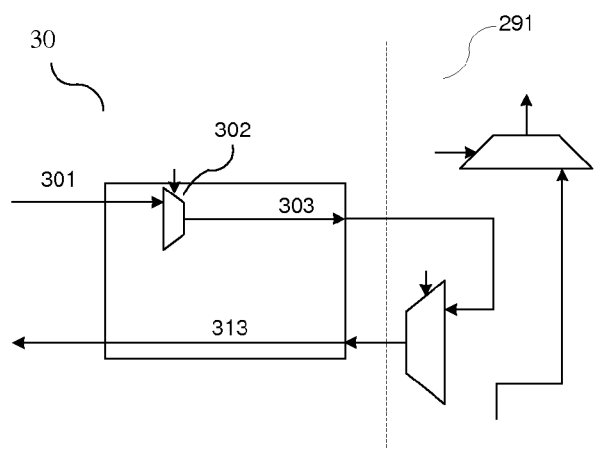
FIG. 4 illustrates a port in the bypass mode.

FIG. 4 illustrates the port in the bypass mode. As illustrated, the port 30 can receive the test traffic from the outside of the chip via the connection 301 and then loop the received test traffic back to the outside of the chip via connections 303 and 313; in addition, the test traffic along the test chain of the chip directly bypasses the port 30, i.e., the test traffic along the test chain 291 of the chip (only part of which is shown in FIG. 4) does not pass through the port 30.

Figure 5:
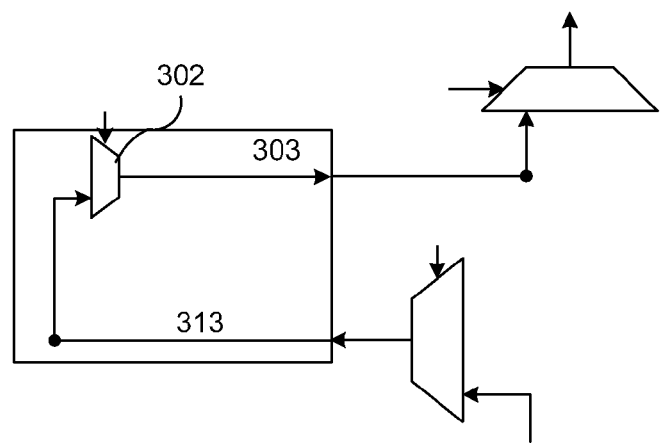
FIG. 5 illustrates a port in the near end loopback mode.

FIG. 5 illustrates the port in the near end loopback mode. As illustrated, the port 30 can receive the test traffic from the test chain via the connection 313 and then loop the received test traffic back to the test chain via the connection 303.

The test chain and ports in each chip of the multi-chip system can be used to form the test path for each chip. The test path for each chip of the multi-chip system is connected by internal ports of the system, and thereby forming the test path for the multi-chip system. The test traffic can be injected to the test path through any one of external port(s), transmits through said test path with each port of the multi-chip system being set as a specific mode, and then is received by a device such as a test traffic generator. Since the test path is provided in a way of bypassing the internal logic circuit of each chip in the multi-chip system, the test traffic can transmit along the test path without entering into said internal logic circuits. Furthermore, each port of the multiple ports of the multi-chip system can experience the test traffic based on the set working mode of each port.

The method according to the embodiments of the present invention is further discussed with respect to a two-chip system and a four-chip system. It is noted that the examples in combination with the two-chip and four-chip systems are intended to fully convey the spirit of the present invention rather than limit the present invention. Those skilled in the art understand the method of the invention can be used not only for the four-chip or two-chip system, but also can be used for five-chip, eight-chip system, or the like.

Figure 6:
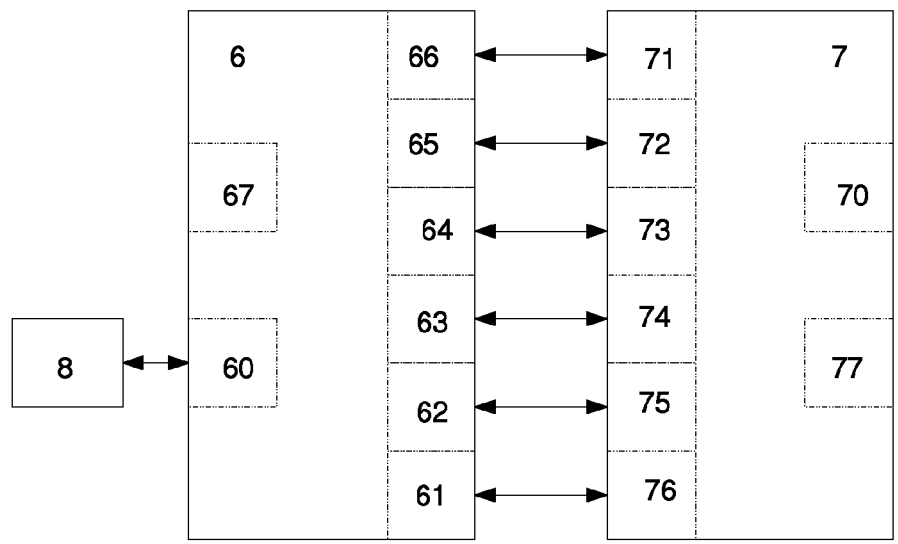
FIG. 6 illustrates a two-chip system.

FIG. 6 illustrates a two-chip system. In the two chip-system, chips 6 and 7 are electrically interconnected each other through the internal ports, i.e., ports 61, 62, 63, 64, 65 and 66 at the chip 6 and the ports 76, 75, 74, 73, 72, and 71 at the chip 7. Ports 67 and 60 at the chip 6 and ports 70 and 77 at the chip 7 are used to electrically connect the two-chip system to other system or device. Therefore the ports 60, 67, 70, and 77 are external port.

All ports of the chip 6 are electrically connected to the test chain (not shown) of the chip 6 as above discussed. Likewise, all ports at the chip 7 are electrically connected to the test chain (not shown) of the chip 7. The test path for the two-chip system is formed by electrically connecting the chip 6 with chip 7 via those internal ports.

Any external port of the two-chip system can be selected to electrically connect to an external test traffic generator, such as external port 60, 67, 70 or 77, so that the test traffic can be injected to said system to test the hardware of the two-chip system with the internal logic circuit of each chip being bypassed, such as the hardware connectivity of the system, the interface protocol, the signal integrity of the two-chip system.

In the system shown in FIG. 6, the external port 60 is illustratively not limiting selected to electrically connect to the external test traffic generator 8. When the two-chip system is in the external traffic test mode, the test traffic generated by the external test traffic generator 8 is injected to the test path of the system through the external port 60. The external pot 60 is set as the normal mode; while the other external ports of the system including the external ports 67, 70, and 77 can be set as near end loopback mode or normal mode. The term "external traffic test mode" herein refers to the mode where the test traffic to be injected to a chip or multi-chip system to be tested is generated by an external test traffic generator.

EXAMPLE 1

In this example, the external ports in the two-chip system except the external port 60 are set as the near end loopback mode. Namely, the external port 60 through which the test traffic is injected from the external test traffic generator 8 to the two-chip system is set as the normal mode while the other external port 67 is set as the near end loopback mode.

The test traffic is transmitted from the external port 60 to the internal port 61 along the test path and then to the port 76 at the chip 7. As the internal port 61 is electrically connected to the internal port 76 at the chip 7 and the chip 6 experiences the test traffic earlier than the chip 7, the internal port 61 is set as the normal mode. As the internal port through which the test traffic is first transmitted to the chip 7, the internal port 76 is set as the normal mode. For the internal ports 62, 63, 64, 65 and 66 connected to the chip 7, they each are set as the normal mode as the chip 6 experiences the test traffic earlier than the chip 7 in the two-chip system. For the internal ports 71, 72, 73, 74, and 75 connected to the chip 6, they each are set as the bypass mode as the chip 7 experiences the test traffic later than the chip 6 in the two-chip system. In this embodiment, the external port 67, 70 and 71 are set as near and loop back mode. With the set test mode for each port of the two-chip system, the test traffic injected to said system is transmitted through each port of said system such that the hardware features of the system, such as hardware connectivity of said system, signal integrity of the transmitted signal etc., are tested.

Figure 7:
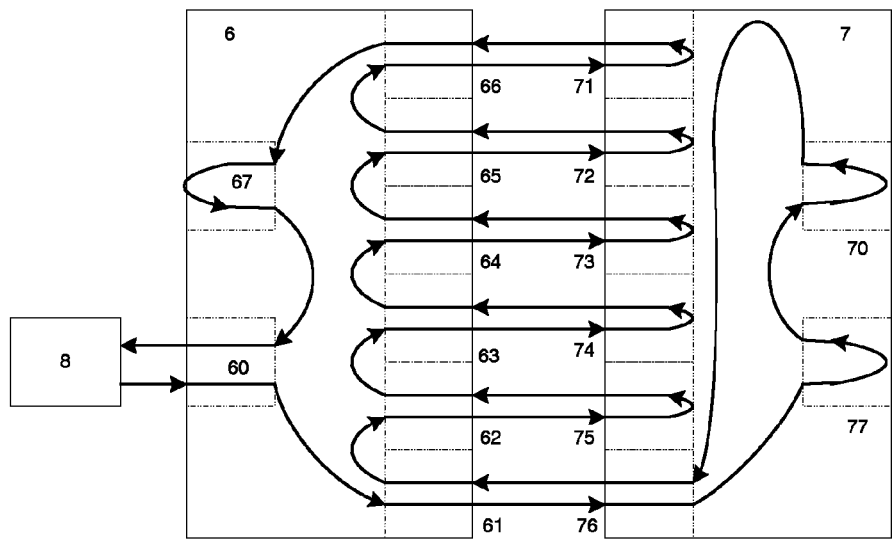
FIG. 7 shows the transmission of the test traffic in the two-chip system of FIG. 6 according to an embodiment of the present invention.

FIG. 7 shows the transmission of the test traffic in the two-chip system of FIG. 6. As shown, the external port 60 working in the normal mode receives the injected test traffic from the external test traffic generator 8 and then injects the received test traffic to the test chain (not shown) of the chip 6. The external port 61 working in the normal mode receives the test traffic from the test chain and transmits it to the internal port 76 at the chip 7. The internal port 76 working in the normal mode injects the received test traffic to the test chain of the chip 7. The external port 77, working in the near end loopback mode, receives the test traffic from the test chain and then loop the received test traffic back to the test chain. The external port 70, working in the near end loopback mode, then receives test traffic from the test chain and loops the received test traffic back to the test chain. The test traffic in the test chain then directly bypasses the internal ports 71, 72, 73, 74, and 75, each of which is in the bypass mode, and is transmitted to the internal port 76. As working in the normal mode, the internal port 76 receives the test traffic and then transmits it to the chip 6 through the internal port 61. Upon receiving the test traffic from the chip 7, the port 61 injects it to the test chain of the chip 6. The internal port 62 working in the normal mode receives the test traffic from the test chain of the chip 6 and transmits the received test traffic to the internal port 75 at the chip 7. As working in bypass mode, the internal port 75 loops the received test traffic back to the port 62. The port 62 injects the test traffic received from the internal port 75 to the test chain of the chip 6. The test traffic is then transmitted to the internal port 63. The internal port 63, working in the normal mode, then transmits the received test traffic to the internal port 74 at the chip 7. As working in bypass mode, the internal port 74 loops the received test traffic back to the port 63 and the port 63 injects the received test traffic to the test chain of the chip 6. The test traffic is then transmitted to the internal port 64 via the test chain. The internal port 64, working in the normal mode, transmits the received test traffic to the internal port 73 at the chip 7. As working in bypass mode, the internal port 73 loops the received test traffic back to the port 64 and the port 64 injects the received test traffic to the test chain of the chip 6. The test traffic is then transmitted to the internal port 65 via the test chain. The internal port 65, working in the normal mode, transmits the received test traffic to the internal port 72 at the chip 7. As working in bypass mode, the internal port 72 loops the received test traffic back to the port 65 and the port 65 injects the received test traffic to the test chain of the chip 6. The test traffic is then transmitted to the internal port 66 via the test chain. The internal port 66, working in the normal mode, then transmits the received test traffic to the internal port 71 at the chip 7. As working in bypass mode, the internal port 71 loops the received test traffic back to the port 66 and the port 66 injects the received test traffic to the test chain of the chip 6. The test traffic is then transmitted to the external port 67 via the test chain. The external port 67, working in the near end loopback mode, loops the received test traffic to the test chain of the chip 6. The test traffic is then transmitted to the external port 60 in the normal mode and final transmits to the external test traffic generator 8.

The test traffic injected to the two-chip system is transmitted through the test path with bypassing the internal logic circuit of each chip of the system; meanwhile, each port of the system can experience the test traffic with the set working mode. The port at the chip 6 in normal mode injects the test traffic to the test chain of chip 6 upon receiving it from the external test traffic generator 8 or from the chip 7, and transmits the test traffic to the external test traffic generator 8 or from the chip 7 upon receiving it from the test chain, such as ports 60, 61, 62, 63, 64, 65, and 66. The port at the chip 7 in normal mode injects the test traffic to the test chain of chip 7 upon receiving it from the chip 6, and transmits the test traffic to the chip 6 upon receiving it from the test chain of the chip 7, such as the port 76. The port in near end loopback mode receives the test traffic from the test chain and then directly injects it to the respective test chain, such as the ports 67, 70 and 77. The port at the chip 7, such as the ports 75, 74, 73, 72, and 71, in bypass mode receives the test traffic from the outside of chip 7, such as chip 6, and loops it back to the outside, and meanwhile the test traffic in chip 7 bypass this port.

As explained, the test traffic in a chip is transmitted only along the test chain of this chip when it is not transmitted into the ports of this chip such that the test traffic does not enter the internal logic circuit of the chip. Accordingly, the test traffic in the two-chip system does not enter the internal logic circuit of each chip in the system. So the internal logic circuits can be independent of the test path of the system when the hardware of the system is under test, where the hardware of the system refers to the hardware with an exception of the internal logic circuit as above mentioned. It is thus possible to run the test traffic through the hardware of the two-chip system as early as possible to verify potential defect on the system design, such as the PCB, without considering of the internal logic circuit and related software issues. Further, with bypassing the internal logic circuit, the hardware test according to the method of the present application is independent of the functionality of each chip in the system, thereby little software effort is required to run the test traffic through the test path.

EXAMPLE 2

The test path of two-chip system according to this example is similar to that illustrated hereinbefore in example 1 with an exception that the external ports of the two-chip system but the one, through which the test traffic is injected to the two-chip system, are electrically connected to respective cables outside of said system. Further, all of the external ports are set as the normal mode.

In this example, each external port at any of chips 6 and 7 transmits the test traffic to a connected external device upon receiving it from the respective test traffic (i.e., each external port at chip 6 receives the test traffic from the test chain of the chip 6, and each external port at chip 7 receives from the test chain of the chip 7), and then receiving the test traffic from the external device and injects it to that test chain. For the external port 60, the connected external device is the external test traffic generator 8 and for other external ports 67, 70 and 77, the connected external devices are cables respectively connected to them.

Figure 8:
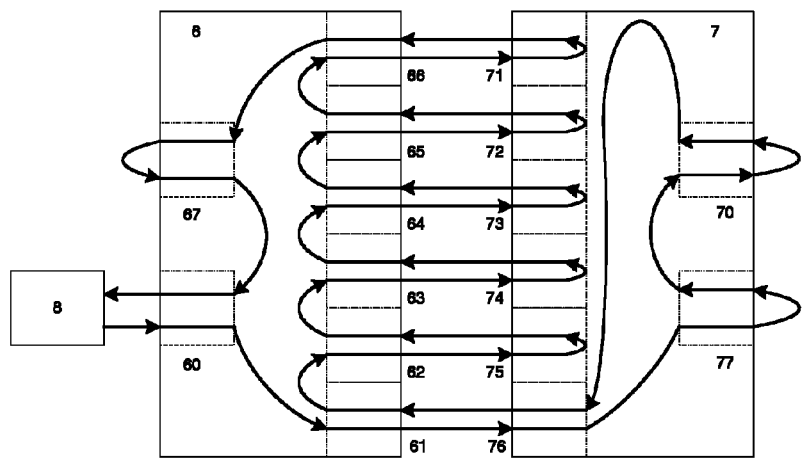
FIG. 8 illustrates the transmission of the test traffic in the two-chip system according to another embodiment of the present invention.

FIG. 8 illustrates the transmission of the test traffic in the two-chip system according to example 2. As shown, the transmission of the test traffic in the internal ports of the two-chip system in FIG. 8 is the same as that shown in FIG. 7. The external port 67 transmits the test traffic to the connected cable upon receiving it from the test chain of the chip 6, and receives the test traffic from the cable and then injecting it to the test chain. Each of the external ports 77 and 70 transmits the test traffic to the connected cables, upon receiving it from the test chain of the chip 7, and receives the test traffic from the connected cables and then injecting it to the test chain.

As the test traffic is transmitted to and from outside of the multi-chip system through external ports thereof, the EMC/EMI test for the system is conducted.

Figure 9:
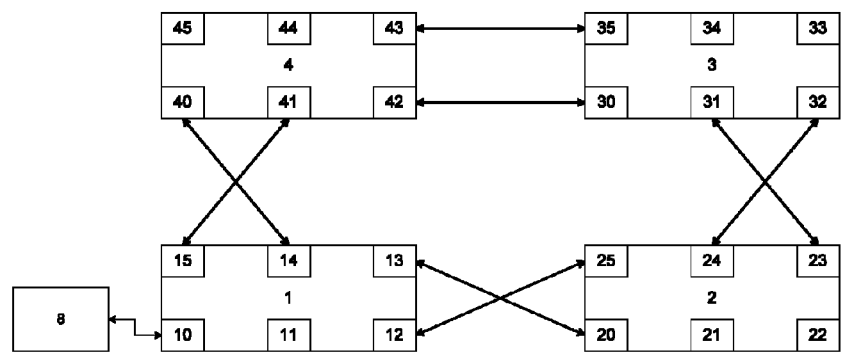
FIG. 9 illustrates a four-chip system.

FIG. 9 illustrates a four-chip system. In the illustrated system, each chip has six ports. Chips 1 and 2 are electrically interconnected via the internal ports 12 and 13 at the chip 1 and the internal ports 25 and 20 at the chip 2. Chips 2 and 3 are electrically interconnected via the internal ports 23 and 24 at the chip 2 and the internal ports 31 and 32 at the chip 3. Chips 3 and 4 are electrically interconnected via the internal ports 35 and 30 at the chip 3 and the internal ports 43 and 42 at the chip 4. Chips 4 and 1 are electrically interconnected via the internal ports 40 and 41 at the chip 4 and the internal ports 14 and 15 at the chip 1. The ports 10, 11, 21, 22, 33, 34, 44, and 45, used to connect the four-chip system to other system or device, are external port.

Any external port of the four-chip system can be selected to electrically connect to an external test traffic generator, such as external port 10, 11, 21, 22, 33, 34, 44, and 45 so that the test traffic can be injected to said system to test the related capabilities of the hardware of the four-chip system, such as the connectivity of the interface and the integrity of the transmitted signal. The test traffic injected to the four-chip system is transmitted from the chip 1 to the chip 2, from the chip 2 to the chip 3, from the chip 3 to the chip 4, from the chip 4 to the chip 1, and final from the chip 1 return to the external test traffic generator 8, according to this example.

The external port 10 in the system shown in FIG. 9 is illustratively selected to electrically connect to the external test traffic generator 8. The external port 10 is set as the normal mode. Similar to the embodiments of the two-chip system as above discussed, the external ports of the four-chip system except the port 10, through which the test traffic generated by the external test traffic generator 8 is injected to the four-chip system, can be set as either the near end loopback mode or the normal mode.

EXAMPLE 3

In this example, the external ports except the external port 10 are set as the near end loopback mode. Namely, the external port 10 through which the test traffic generated by the external test traffic generator 8 is injected to the four-chip system is set as the normal mode while the other external ports are set as the near end loopback mode.

The external port 10 is set as the normal mode and the external port 11 is set as the near end loopback mode. As the internal port 12 at the chip 1 is electrically connected to the internal port 25 of the chip 2 and the chip 1 experiences the test traffic earlier than the chip 2, the internal port 12 is set as the normal mode. As the internal port through which the test traffic is first transmitted to the chip 2, the internal port 25 is set as the normal mode. As the chip 1 experiences the test traffic earlier than the ship 2, the port 13, connected to the internal port 20 at the chip 2, is set as the normal mode, while the port 20 is set as the bypass mode since it is not the port through the test traffic is first transmitted to the chip 2. The internal ports 23 and 24 at the chip 2 are connected to the internal ports 31 and 32 at the chip 3. As the chip 2 experiences the test traffic earlier than the chip 3, the internal ports 23 and 24, connected to the internal ports 31 and 32 at the chip 3, respectively, are set as the normal mode. The internal port 31 is the internal port through which the test traffic is first transmitted to the chip 3 and thus it is set as the normal mode. As the chip 3 experiences the test traffic later than the chip 2 and the internal port 32 is not the internal port through which the test traffic is first transmitted to the chip 3, the internal port 32 is set as the bypass mode. As the chip 3 experiences the test traffic earlier than the chip 4, the internal ports 35 and 30, connected to the internal ports 43 and 42 at the chip 4, are set as the normal mode. The internal port 43 is the internal port through which the test traffic is first transmitted to the chip 4, and thus it is set as the normal mode. As the internal port 42 is not the internal port through which the test traffic is first transmitted to the chip 4 and the chip 4 experiences the test traffic later than the chip 3, it is set as the bypass mode. As the chip 1 experiences the test traffic earlier than the chip 4, the internal ports 15 and 14, connected to the internal ports 40 and 45 at the chip 4 are set as the normal mode. The internal ports 40 and 41 is not the internal port through which the test traffic is first transmitted to the chip 4 and the chip 4 experiences the test traffic later than the chip 1, and the internal ports 40 and 41 are therefore set as the bypass mode.

The test traffic injected from the external port 10 to the four-chip system is transmitted to the external port 11 along the test chain of the chip 1. The external port 11 in near end loopback mode injects the test traffic received from the test chin of the chip 1 to the test chain. The test traffic is transmitted to the internal port 12 along the test chain in the chip 1. The internal port 12 in the normal mode transmits the test traffic to the internal port 25 of the chip 2.

The internal port 25 in the normal mode transmits the test traffic to the external port 21 at the chip 2 after receiving the test traffic from the chip 1 for the internal port 20 in bypass mode is bypassed. The external port 21 in the near end loopback mode loops the received test traffic back to the test chain of the chip 2. The test traffic is then transmitted to the external port 22. The external port 22 in the near end loopback mode loops the received test traffic back to the test chain of the chip 2. The test traffic is then transmitted to the internal port 23. The internal port 23 in the normal mode transmits the received test traffic from the test chain to the chip 3 outside of the chip 2. The internal port 31 at the chip 3 in the normal mode receives the test traffic from the internal port 23 at the chip 2 and then injects the received test traffic to the test chain of the chip 3. As the internal port 32 at the chip 3 in the bypass mode, the test traffic is directly transmitted to the external port 33 at the chip 3. The external port 33 in near end loopback mode loops the received test traffic back to the test chain of the chip 3. The test traffic is then sent to the external port 34 at the chip 3. The external port 34 in near end loopback mode loops the received test traffic back to the test chain of the chip 3. The test traffic is then transmitted to the internal port 35 at the chip 3. The internal port 35 in the normal mode transmits the test traffic from the chip 3 to the chip 4 through the internal port 43 at the chip 4. The internal port 43 in the normal mode then injects the received test traffic to the test chain of the chip 4. The test traffic is transmitted to the external port 44 in the near end loopback mode. The external port 44 loops the received test traffic back to the test chain of the chip 4. The test traffic is then sent to the next external port 45 at the chip 4. The external port 45 in near end loopback mode loops the received test traffic back to the test chain. Then, the test traffic is directly transmitted to the internal port 43 and bypasses the internal ports 40, 41 and 42 which are in the bypass mode. The internal port 43 receives the test traffic from the test chain of the chip 4 and then transmits the received test traffic to the internal port 35. The internal port 35 injects the received test traffic to the test chain of the chip 3. The test traffic is then transmits to the internal port 30 at the chip 3. The internal port 30 in the normal mode transmits the received test traffic from the test chain of the chip 3 to the internal port 42 at the chip 4. The internal port 42 in the bypass mode loops the received test traffic back to the internal port 30. The internal port 30 then injects the received test traffic from the chip 4 to the test chain of the chip 3. The test traffic in the chip 3 is then transmitted to the internal port 31. The internal port 31 then transmits the received test traffic from the test chain of the chip 3 to the internal port 23 at the chip 2. The internal port 23 in the normal mode then injects the received test traffic from the chip 3 to the test chain of the chip 2. The test traffic is then transmitted along the test chain of the chip 2 to the internal port 24. The internal port 24 then transmits the received test traffic from the test chain of the chip 2 to the internal port 32 at the chip 3. The internal port 32 in the bypass mode loops the received test traffic back to the port 24. The port 24 then injects the received test traffic to the test chain of the chip 2. The test traffic is then transmitted to the internal port 25. The internal port 25 in the normal mode then transmits the received test traffic from the test chain of the chip 2 to the internal port 12 at the chip 1. The internal port 12 then injects the received test traffic from the chip 2 to the test chain of the chip 1. The test traffic is then transmitted to the internal port 13. The internal port 13 in the normal mode then transmits the received test traffic from the test chain of chip 1 to the internal port 20 at the chip 2. The internal port 20 in the bypass mode loops the received test traffic back to the internal port 13. The internal port 13 then injected the received test traffic from the chip 2 to the test chain of the chip 1. The test traffic is then sent to the internal port 14. The internal port 14 in the normal mode transmits the received test traffic from the test chain of the chip 1 to the internal port 40 at the chip 4. The internal port 40 in the bypass mode loops the received test traffic back to the internal port 14. The internal port 14 then injects the received test traffic to the test chain of the chip 1. The test traffic is transmitted to the port 15 along the test chain. The internal port 15 in the normal mode transmits the received test traffic to the internal port 41 at the chip 4. The internal port 41 in the bypass mode loops the received test traffic back to the internal port 15. The internal port 15 then injected the received test traffic from the chip 4 to the test chain of the chip 1. The test traffic is then transmitted to the external port 10 along the test chain. The external port 10 final transmits the received test traffic to the external traffic generator 8.

As explained, without entering into the internal logic circuit of each chip in the four-chip system, the hardware test according to the method of the present application is independent of the functionality of each chip in the system. Therefore, the conduction of hardware test for the system according to the present invention can be earlier than that according to the conventional test techniques for little dependency on the software effort. Further, with almost independency of the software applied to the system, it can be determined as the problem of the hardware when occurring in test.

EXAMPLE 4

In this example, all of the external ports including the external port 10 through which the test traffic generated by the external test traffic generator 8 is injected to the four-chip system are set as normal mode.

The test path of four-chip system according to this example is similar to that illustrated in the example 3 with an exception that each of the external ports 11, 21, 22, 33, 34, 44, and 45 of the four-chip system in this example are electrically to respective cables outside of the four-chip system.

When the four-chip system is under test, the transmission of the test traffic along the test chain of each chip and all the internal ports in this example is the same as the transmission of the test traffic discussed in the example 3. Therefore, we will not describe such transmission herein. For the external ports 11, 21, 22, 33, 34, 44, and 45 of the four-chip system, they will transmits the received test traffic to the respective cables and then injects the test traffic received from the respective cables to the respective test chain. In this example, the EMC/EMI of each external port can be tested since the test traffic is transmitted to and receives from the cable in the exterior of the system.

Figure 10:
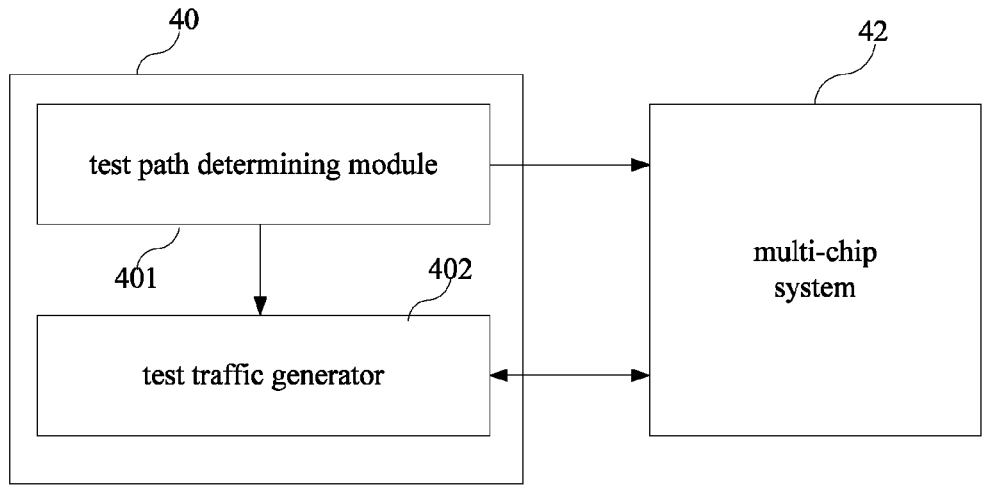
FIG. 10 illustrates a block diagram of a system for testing a multi-chip system, in which the multi-chip system includes two or more chips and more than two ports.

FIG. 10 illustrates a block diagram of a system 40 for testing a multi-chip system 42, in which the multi-chip system includes two or more integrated circuit chips and includes more than two ports. The system 40 for testing a multi-chip system 42 includes a test path determining module 401 and a test traffic generator 402. The test determining module 401 is configured to determine a test path which is formed by connecting the multiple ports, in which the test path is determined in such a way that internal logic circuit of each chip in the multi-chip system 42 is bypassed. The test traffic generator 402 is configured to generate a test traffic, transmit the test traffic to the test path of the multi-chip system 42, and receive the test traffic from the test path.

The system 40 for testing the multi-chip system 42 can be implemented as software module, hardware module, or the combination thereof which can be provided in a data processing device, such as a computer.

Any chip in the multi-chip system 42 to be tested can be configured with the similar internal structure shown in FIG. 2. It can be understood by those skilled in the art that the number of the ports in any chip of the multi-chip system 42 can differ from that of the chip shown in FIG. 2. For example, the number of the ports in any chip of the multi-chip system 42 can be 4, 8 etc.

For any chip of the multi-chip system 42 to be tested, a test path can be formed by the ports and the test chain to which each of the ports of this chip is electrically connected. For the multi-chip system 42, the test path for the system is formed by electrically connecting the test path for each chip via the internal ports of the multi-chip system.

Further, the test path determining module 401 can determines the working mode of each port so as to enable each port of the multi-chip system can experience the test traffic generated by the test traffic generator 402 when said system is under test. Any port of the external ports through which the test traffic generated by the test traffic generator 402 is injected to the multi-chip system is set as a normal mode by the test path determining module 401, and the other external ports is set as a near end loopback mode or the normal mode by the test path determining module 401. Further, for an internal port at a chip of the multi-chip system, if said internal port is an internal port through which the test traffic is first transmitted to said chip, it is set as the normal mode by the test path determining module 401. For an internal port in a first chip via which the first chip is connected to a second chip in the multi-chip system, said internal port is set as the normal mode by the test path determining module 401 if the first chip experiences the test traffic earlier than the second chip, or said internal port is set as a bypass mode by the test path determining module 401 in the case that the first chip experiences the test traffic later than the second chip and at the same time said internal port is not the internal port through which the test traffic is first transmitted to the first chip. The test path determining module 401 can set the working mode for any port of the multi-chip system 42 by for example sending a message regarding the working mode to the mode selecting elements in the chip, as shown in the FIG. 2, related to that port such that the mode selecting element set the work mode as the message.

The normal mode, the near and loop mode, and the bypass mode have been described above.

According to the system for testing the multi-chip system, the test path determining module 401 can determine the test path, where the test chain and ports in each chip of the multi-chip system can form the test path for each chip, and further the test path for each chip of the multi-chip system can be connected by the internal ports of the system to form the test path for the multi-chip system. A test traffic generated by the test traffic generator 402 can be injected to the test path of the multi-chip system 42 through an external port, then transmits throughout said test path, and finally is received by the test traffic generator 402. Since the test path is provides in a way of bypassing the internal logic circuit of each chip in the multi-chip system 42, the test traffic can transmit along the test path without entering into said internal logic circuit. Furthermore, each port of the multiple ports of the multi-chip system can experience the test traffic based on the working mode of each port which has been set via the test determining module 401.

As an exemplary example, the system for testing the multi-chip system according to the invention is further set forth in combination with an examplary two-chip system shown in FIG. 6 and four-chip system shown in FIG. 9. It should be noted that the description combined the two-chip and four-chip systems is intended to fully convey the spirit of the present invention to those skilled in the art rather than limiting the present invention. Those skilled in the art understand that the system according to the invention can also be used in five-chip, eight-chip system, or the like.

With referent to FIG. 10 and FIG. 6, the system for testing the multi-chip system is described in combination with the two-chip system. That is, in the description referring to FIG. 10 and FIG. 6, the multi-chip system 42 can be the two-chip system shown in FIG. 6.

We will use the reference number 42 to represent the two-chip system shown in FIG. 6 in this example. In the two-chip system 42, any external port can be selected to electrically connect to the test traffic generator 402, such as external port 60, 67, 70 or 77, so that the test traffic can be injected to said system 42 to test the hardware of the two-chip system 42, such as the connectivity of the trace between the two chips, the interface protocol, the signal integrity, EMC/EMI of the two-chip system. In the two-chip system, the external port 60 is illustratively not limiting selected to electrically connect to the test traffic generator 402. When the two-chip system 42 is in the external traffic test mode, the test traffic generated by the test traffic generator 402 is injected to the test path of the two-chip system 42 through the external port 60. The external port 60 is set as the normal mode; while the other external ports of the same system can be set as either the near end loopback mode or the normal mode, including the external ports 67, 70, and 77.

EXAMPLE 5

In this example, the external port 60 through which the test traffic is injected by the test traffic generator 402 to the two-chip system 42 is set as the normal mode by the test path determining module 401, and all of the other external ports in the two-chip system 42 are set as the near end loopback mode.

The test traffic generated by the test traffic generator 402 is injected to the chip 6 through the external port 60. The test traffic is then transmitted to the internal port 61 along the test path and then to the port 76 of the chip 7. As the internal port 61 is electrically connected to the internal port 76 of the chip 7 and the chip 6 experiences the test traffic earlier than the chip 7, the internal port 61 is set as the normal mode by the test path determining module 401. As the internal port through which the test traffic is first transmitted to the chip 7, the internal port 76 is set as the normal mode by the test path determining module 401. For the internal ports 62, 63, 64, 65 and 66, which are electrically connected to the internal ports 75, 74, 73, 72, and 71 at the chip 7, they each are set as the normal mode by the test path determining module 401 as the chip 6 experiences the test traffic earlier than the chip 7 in the two-chip system; while the internal ports 71, 72, 73, 74, and 75 are set by the test path determining module 401 as the bypass mode as the chip 7 experiences the test traffic later than the chip 6 in the two-chip system. Further, in this embodiment, the external port 67, 70 and 71 are set as near end loopback mode by the test path determining module 401. With the test mode for each port of the two-chip system is set by the test path determining module 401, the test traffic is transmitted through each port of the two-chip system 42 such that the capabilities of the hardware of this system, such as the connectivity of the whole interface of said system 42, the integrity of the transmitted signal, are tested.

FIG. 7 shows the transmission of the test traffic in the two-chip system of FIG. 6 according to this example. As shown, the external port 60 working in the normal mode receives the injected test traffic from the test traffic generator 402 and then injects the received test traffic to the test chain (not shown) of the chip 6. The test traffic then transmits through the test path for the two-chip system as above described with reference to FIG. 7.

As above mentioned, the test for the hardware of the two-chip system is independent of the internal logic circuit of each chip in this system. It is thus possible to test the hardware of the two-chip system as early as possible to verify potential defect on the system design, such as the PCB, by using the system for testing the multi-chip system according to an embodiment of the present application.

EXAMPLE 6

In this example, all external ports in the two-chip system 42 are set as the normal mode by the test path determining module 401.

Compared to the two-chip system in the example 5, the external ports but the external port through which the test traffic is injected to the two-chip system are electrically connected to respective cables outside of said two-chip system.

Therefore, the external port 67 transmits the received test traffic from the test chain in chip 6 to the respective cable, then receives the test traffic from the cable and injects the received test traffic to the test chain of the chip 6. The external ports 70 and 77 transmit the received test traffic from the test chain of the chip 7 to the respective cables, then receive the test traffic from the respective cables and inject the received test traffic to the test chain of the chip 7.

FIG. 8 illustrates the transmission of the test traffic in the two-chip system according to the example 6. As shown, the transmission of the test traffic in the test path for the two-chip system in FIG. 8 is the same as that of the test traffic in the test path for the two-chip system in FIG. 7 except the transmission via the ports 67, 70 and 77.

As the test traffic is transmitted to and from outside of the chips 6 and 7 through the external ports 67, 70 and 77, the EMC/EMI test for the system can be conducted.

With referent to FIG. 10 and FIG. 9, the system for testing the multi-chip system is described in combination with the four-chip system. That is, in the description with reference to FIG. 10 and FIG. 9, the multi-chip system 42 can be the four-chip system shown in FIG. 9.

We will use the reference number 42 to represent the four-chip system shown in FIG. 9 in this example. In the four-chip system shown in FIG. 9, chips 1 and 2 are electrically interconnected via the internal ports 12 and 13 at the chip 1 and the internal ports 25 and 20 at the chip 2. Chips 2 and 3 are electrically interconnected via the internal ports 23 and 24 at the chip 2 and the internal ports 31 and 32 at the chip 3. Chips 3 and 4 are electrically interconnected via the internal ports 35 and 30 at the chip 3 and the internal ports 43 and 42 at the chip 4. Chips 4 and 1 are electrically interconnected via the internal ports 40 and 41 at the chip 4 and the internal ports 14 and 15 at the chip 1. The ports 10, 11, 21, 22, 33, 34, 44, and 45, used to connect the four-chip system to other system or device, are external port.

Any external port of the four-chip system can be selected to electrically connect to an test traffic generator 402, such as external port 10, 11, 21, 22, 33, 34, 44, and 45 so that the test traffic can be injected to said system to test the related capabilities of the hardware of the four-chip system, such as the connectivity of the interface and the integrity of the transmitted signal. The test traffic injected to the four-chip system is transmitted from the chip 1 to the chip 2, from the chip 2 to the chip 3, from the chip 3 to the chip 4, from the chip 4 to the chip 1, and final from the chip 1 return to the external test traffic generator 402.

The external port 10 in the system shown in FIG. 9 is for example selected to electrically connect to the test traffic generator 402. The external pot 10 is set as the normal mode by the test path determining module 401. Similar to the embodiments of the two-chip system as above discussed, the external ports of the four-chip system except the port 10, through which the test traffic generated by the test traffic generator 402 is injected to the four-chip system, can be set as the near end loopback mode or the normal mode by the test path determining module 401.

EXAMPLE 7

In this example, the external port 10 through which the test traffic generated by the test traffic generator 402 is injected to the four-chip system 42 is set as the normal mode by the test path determining module 401; while the other external ports of the four-chip system 42 are set as the near end loopback mode by the test path determining module 401.

In chip 1 of the four-chip system, the test traffic from the external port 10 is transmitted to the external port 11 along the test path and then to the internal port 12 through which the test traffic is transmitted to the internal port 25 of the chip 2. As the internal port 12 at the chip 1 is electrically connected to the internal port 25 of the chip 2 and the chip 1 experiences the test traffic earlier than the chip 2, the internal port 12 is set as the normal mode by the test path determining module 401. As the internal port through which the test traffic is first transmitted to the chip 2, the internal port 25 is set as the normal mode by the test path determining module 401. As the chip 1 experiences the test traffic earlier than the ship 2, the port 13, connected to the internal port 20 at the chip 2, is set as the normal mode by the test path determining module 401, while the port 20 is set as the bypass mode by the test path determining module 401 since it is not the internal port through the test traffic is first transmitted to the chip 2. The internal ports 23 and 24 of the chip 2 are connected to the internal ports 31 and 32 at the chip 3. As the chip 2 experiences the test traffic earlier than the chip 3, the internal ports 23 and 24, connected to the internal ports 31 and 32 at the chip 3, respectively, are set as the normal mode by the test path determining module 401. The internal port 31 is the internal port through which the test traffic is first transmitted to the chip 3 and thus it is set as the normal mode by the test path determining module 401. As the chip 3 experiences the test traffic later than the chip 2 and the internal port 32 is not the internal port through which the test traffic is first transmitted to the chip 3, the internal port 32 is set as the bypass mode by the test path determining module 401. As the chip 3 experiences the test traffic earlier than the chip 4, the internal ports 35 and 30, connected to the internal ports 43 and 42 at the chip 4, are set as the normal mode by the test path determining module 401. The internal port 43 is the internal port through which the test traffic is first transmitted to the chip 4, and thus it is set as the normal mode by the test path determining module 401. As the internal port 42 is not the internal port through which the test traffic is first transmitted to the chip 4 and the chip 4 experiences the test traffic later than the chip 3, it is set as the bypass mode by the test path determining module 401. As the chip 1 experiences the test traffic earlier than the chip 4, the internal ports 15 and 14, connected to the internal ports 40 and 45 at the chip 4 are set as the normal mode by the test path determining module 401. The internal ports 40 and 41 is not the internal port through which the test traffic is first transmitted to the chip 4 and the chip 4 experiences the test traffic later than the chip 1, and the internal ports 40 and 41 are therefore set as the bypass mode by the test path determining module 401.

The test traffic injected from the external port 10 to the four-chip system is transmitted to the external port 11 along the test chain of the chip 1. The external port 11 in near end loopback mode injects the test traffic received from the test chin of the chip 1 to the test chain. The test traffic is transmitted to the internal port 12 along the test chain of the chip 1. The internal port 12 in the normal mode transmits the test traffic to the internal port 25 of the chip 2.

The internal port 25 in normal mode transmits the test traffic to the external port 21 after receiving it from the chip 1 with bypassing the internal port 20 in bypass mode. The external port 21 in the near end loopback mode loops the received test traffic back to the test chain of the chip 2. The test traffic is then transmitted to the external port 22. The external port 22 loops the received test traffic back to the test chain of the chip 2. The test traffic is then transmitted to the internal port 23. The internal port 23 in the normal mode transmits the received test traffic from the test chain to the chip 3 outside of the chip 2. The internal port 31 at the chip 3 in the normal mode receives the test traffic from the internal port 23 at the chip 2 and then injects the received test traffic to the test chain of the chip 3. As the internal port 32 is bypassed, the test traffic is directly transmitted to the external port 33. The external port 33 loops the received test traffic back to the test chain of the chip 3. The test traffic is then sent to the external port 34. The external port 34 loops the received test traffic back to the test chain of the chip 3. The test traffic is then transmitted to the internal port 35. The internal port 35 in the normal mode transmits the test traffic from the chip 3 to the chip 4 through the internal port 43 at the chip 4. The internal port 43 in the normal mode then injects the received test traffic to the test chain of the chip 4. The test traffic is transmitted to the external port 44 in the near end loopback mode. The external port 44 loops the received test traffic back to the test chain. The test traffic is then sent to the next external port 45. The external port 45 also loops the received test traffic back to the test chain of the chip 4. Then, the test traffic is directly transmitted to the internal port 42 and bypasses the internal ports 40, 41 and 42 which are in the bypass mode. The internal port 43 receives the test traffic from the test chain of the chip 4 and then transmits the received test traffic to the internal port 35 at the chip 3. The internal port 35 injects the received test traffic to the test chain of the chip 3. The test traffic is then transmits to the internal port 30. The internal port 30 in the normal mode transmits the received test traffic from the test chain of the chip 3 to the internal port 42. The internal port 42 in the bypass mode loops the received test traffic back to the internal port 30. The internal port 30 then injected the received test traffic from the chip 4 to the test chain of the chip 3. The test traffic in the chip 3 is then transmitted to the internal port 31. The internal port 31 then transmits the received test traffic from the test chain of the chip 3 to the internal port 23 at the chip 2. The internal port 23 in the normal mode then injects the received test traffic from the chip 3 to the test chain of the chip 2. The test traffic in the test chain of the chip 2 is then transmitted to the internal port 24. The internal port 24 then transmits the received test traffic from the test chain of the chip 2 to the internal port 32 at the chip 3. The internal port 32 in the bypass mode loops the received test traffic back to the port 24. The port 24 then injects the received test traffic to the test chain of the chip 2. The test traffic is then transmitted to the internal port 25. The internal port 25 in the normal mode then transmits the received test traffic from the test chain of the chip 2 to the internal port 12 at the chip 1. The internal port 12 then injects the received test traffic from the chip 2 to the test chain of the chip 1. The test traffic is then transmitted to the internal port 13. The internal port 13 in the normal mode then transmits the received test traffic from the test chain of chip 1 to the internal port 20 at the chip 2. The internal port 20 working in the bypass mode loops the received test traffic back to the internal port 13. The internal port 13 then injected the received test traffic from the chip 2 to the test chain of the chip 1. The test traffic is then sent to the internal port 14. The internal port 14 in the normal mode transmits the received test traffic from the test chain of the chip 1 to the internal port 40 at the chip 4. The internal port 40 in the bypass mode loops the received test traffic back to the internal port 14. The internal port 14 then injects the received test traffic to the test chain of the chip 1. The test traffic is transmitted to the port 15 along the test chain. The internal port 15 in the normal mode transmits the received test traffic to the internal port 41 at the chip 4. The internal port 41 in the bypass mode loops the received test traffic back to the internal port 15. The internal port 15 then injects the received test traffic from the chip 4 to the test chain of the chip 1. The test traffic is then transmitted to the external port 10 along the test chain. The external port 10 final transmits the received test traffic to the traffic generator 402.

As above discussion, the test traffic is transmitted in the four-chip system along the test chain and the ports without involving the internal logic circuits of each chip in the four-chip system. In other words, the internal logic circuit of each of the chips of the four-chip system is bypassed by the test path; and accordingly, the internal logic circuit of each chip in the four-chip system is bypassed by the test path.

EXAMPLE 8

In this example, all of the external ports including the external port 10 through which the test traffic generated by the test traffic generator 402 is injected to the four-chip system 42 are set as the normal mode by the test path determining module 401.

The four-chip system in this example is similar to that in the example 7 with an exception that each of the external ports 11, 21, 22, 33, 34, 44, and 45 of the four-chip system in this example are electrically to respective cables provided outside of the four-chip system. According to this example, each external ports of the system is electrically connected to a cable which can receives the test traffic from the port, transmits the received test traffic through itself and back to the connected external port. Further, the external ports 11, 21, 22, 33, 34, 44, and 45 are set as normal mode by the test path determining module 401.

When the four-chip system is under test, the transmission of the test traffic along the test chain of each chip and all the internal ports in this example is the same as the transmission of the test traffic described in the example 7. Therefore, we will not describe such transmission again. For the external ports 11, 21, 22, 33, 34, 44, and 45 of the four-chip system, they will transmits the received test traffic to the respective cables and then injects the test traffic received from the respective cables to the respective test chains. In this example, the EMC/EMI of each external port can be tested by the test traffic is transmitted to and received from the cables outside of the system.

Figure 11:
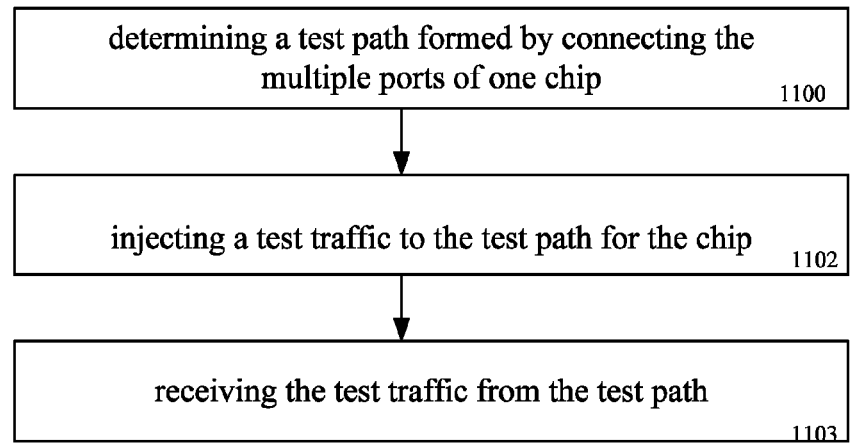
FIG. 11 illustrates a method for testing a chip including multiple ports according to an embodiment of the present invention.

FIG. 11 illustrates a method for testing a chip including multiple ports according to an embodiment of the present invention. The multiple ports in any embodiment with respect to the test for a single chip herein refer to more than one port. As shown, a test path can be determined (step 1100) by forming the test path via connecting the multiple ports at the chip, where the test path is determined in such a way that an internal logic circuit of the chip is bypassed. The internal structure of a chip has been illustratively described with reference to FIG. 2. As above mentioned, the test path for one chip can be formed by the ports and the test chain to which all of the ports are electrically connected. The test chain bypasses the internal logic circuit of the chip, and the test path therefore bypasses the internal logic circuit. A test traffic can be injected (step 1102) to the test path, then run through the test path without entering the internal logic circuit. The test traffic is received (step 1103) from the test path by for example the test traffic generator.

According to the method illustrated in FIG. 11, all of the ports at the chip to be tested can be classified to external port and internal port. If the chip is provided in a system, the external port is used to connect the system to other system which can be a device or an element and the internal port is used to connect the chip to the other chip(s) of the system, as above discussed. In the following embodiments as to testing a single chip, the ports at the chip are classified into the external port and internal port.

Figure 12:
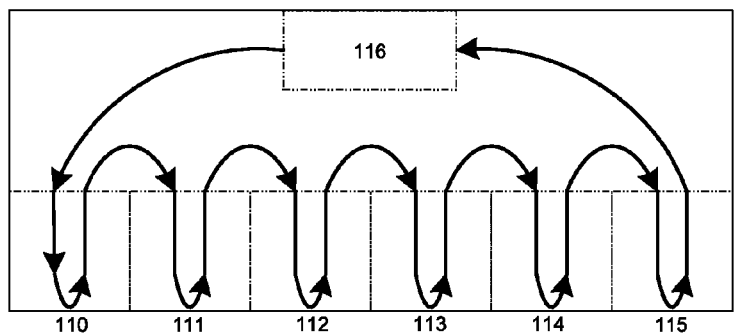
FIG. 12 illustrates a transmission of the test traffic in a chip with six ports when the method shown in FIG. 11 is applied to this chip, according to an embodiment of the present invention.

FIG. 12 illustrates a transmission of the test traffic in a chip with six ports when the method shown in FIG. 11 is applied to this chip, according to an embodiment of the present invention. The test path for this chip is determined by forming it via connecting each of the ports 110, 111, 112, 113, 114, and 115 to a test chain of the chip. The test chain bypasses the internal logic circuit of the chip, and the test path for the chip thus bypasses the internal logic circuit of the chip. All of the ports in the chip are set as the near end loopback mode according to this example. As shown, a built-in test traffic generator 116 in the chip is enabled and generates the test traffic. The built-in test traffic generator has been described with reference to FIG. 2. The built-in test traffic generator is electrically connects to the test chain of the chip via a mode selecting element. When employing the built-in test traffic generator, it is enabled by controlling the mode selecting element. The test traffic can be first injected to any port of the test path. In this example, the test traffic is injected to the port 110. The port 110 then loops the received test traffic back to the test chain, and the port 111 next to the port 110 in the test path receives the test traffic from the test chain and then loops it back to the test chain. The port 112 next to the port 111 in the test path receives the test traffic from the test chain and then loops it back to the test chain. The port 113 next to the port 112 in the test path receives the test traffic from the test chain and then loops it back to the test chain. The port 114 next to the port 113 in the test path receives the test traffic from the test chain and then loops it back to the test chain. The port 115 next to the port 114 in the test path receives the test traffic from the test chain and then loops it back to the test chain. The test traffic is then transmitted to the built-in test traffic generator 116.

As the internal logic circuit is bypassed by the test path, the test for the chip with the built-in test traffic generator 116 generating the test traffic can be performed independent of the internal logic circuit.

Figure 13:
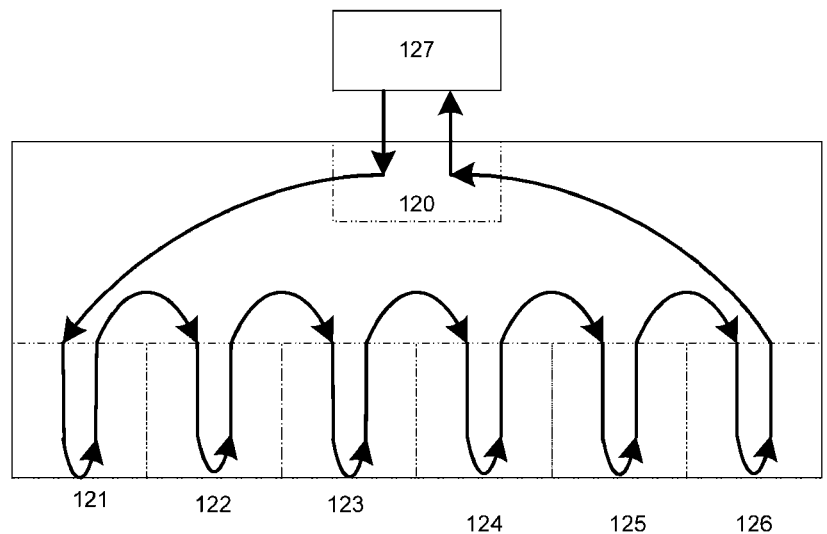
FIG. 13 illustrates a transmission of the test traffic in a chip with seven ports when the method shown in FIG. 10 is applied to this chip, according to an embodiment of the present invention.

FIG. 13 illustrates a transmission of the test traffic in a chip with seven ports when the method shown in FIG. 11 is applied to this chip, according to another embodiment of the present invention. The test path for this chip is determined by forming it via connecting each of the ports 120, 121, 122, 123, 124, 125 and 126 to a test chain of the chip. The test chain bypasses the internal logic circuit of the chip, and the test path for the chip thus bypasses the internal logic circuit of the chip. Any external port of the chip can be used to connect with an external test traffic generator 127 so as to receive the test traffic from and transmits the test traffic to the external test traffic generator 127. In this embodiment, the external port 120 is selected to connect with the external test traffic generator 127. The external port 120, through which the test traffic is injected to the chip, is set as normal mode and the other external port(s) are set as the near end loopback mode. All internal ports at the chip are set as the near end loopback mode. The port 120 transmits the injected test traffic to the port 121 via the test chain of the chip. The port 121 loops the received test traffic back to the test chain. The port 122 next to the port 121 in the test path receives the test traffic from the test chain and then loops it back to the test chain. The port 123 next to the port 122 in the test path receives the test traffic from the test chain and then loops it back to the test chain. The port 124 next to the port 123 in the test path receives the test traffic from the test chain and then loops it back to the test chain. The port 125 next to the port 124 in the test path receives the test traffic from the test chain and then loops it back to the test chain. The port 126 next to the port 125 in the test path receives the test traffic from the test chain and then loops it back to the test chain. The test traffic is then transmitted to the port 120 and then to the external test traffic generator 127.

Figure 14:
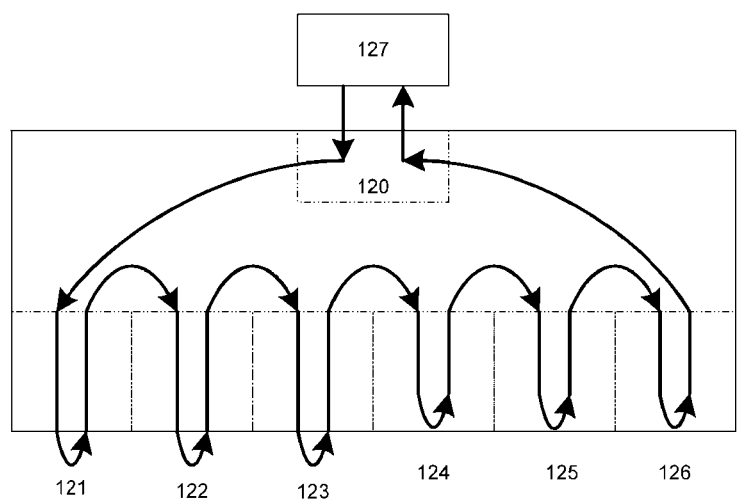
FIG. 14 illustrates a transmission of the test traffic in the chip with seven ports when the method shown in FIG. 11 is applied to this chip, according to yet another embodiment of the present invention.

FIG. 14 illustrates a transmission of the test traffic in the chip with seven ports when the method shown in FIG. 11 is applied to this chip, according to yet another embodiment of the present invention. The test path for the chip is determined by forming it via connecting each of the ports 120, 121, 122, 123, 124, 125 and 125 to a test chain in the chip. Further, according to the embodiment of the present application, each of the external ports of this chip except the one through which the test traffic is injected to the chip is electrically connected to a cable outside of the chip. The test path in this embodiment includes the cables outside of the chip, the ports, and the test chain. The test chain bypasses the internal logic circuit of the chip, and the test path for the chip therefore bypasses the internal logic circuit of the chip. In this embodiment, the external ports can be set as the normal mode and the internal ports can be set as the near end loopback mode. As shown, all external ports 120, 121, 122, and 123 are set as the normal mode and the internal ports 124, 125, and 126 are set as the near end loopback mode. Same to the chip shown in FIG. 13, the test traffic is generated by the external test traffic generator 127 and is injected to the external port 120. The external port 120 transmits the test traffic to the test chain. The external port 121 receives the test traffic from the test chain and transmits the test traffic to the respective cable which is outside of the chip. The external port 121 then injects the test traffic received from the respective cable to the test chain. The external ports 122 and 123 do the same to the test traffic as the external port 121, So for the purpose of simplicity, the description for the transmission of the test traffic through the ports 122 and 123 is omitted. The internal ports 124, 125 and 126 receive the test traffic from the test chain, respectively, and then loop the received test traffic back to the test chain, respectively. Finally, the test traffic is transmitted to the external port 120. The external port 120 further transmits the test traffic to the test traffic generator 127.

Figure 15:
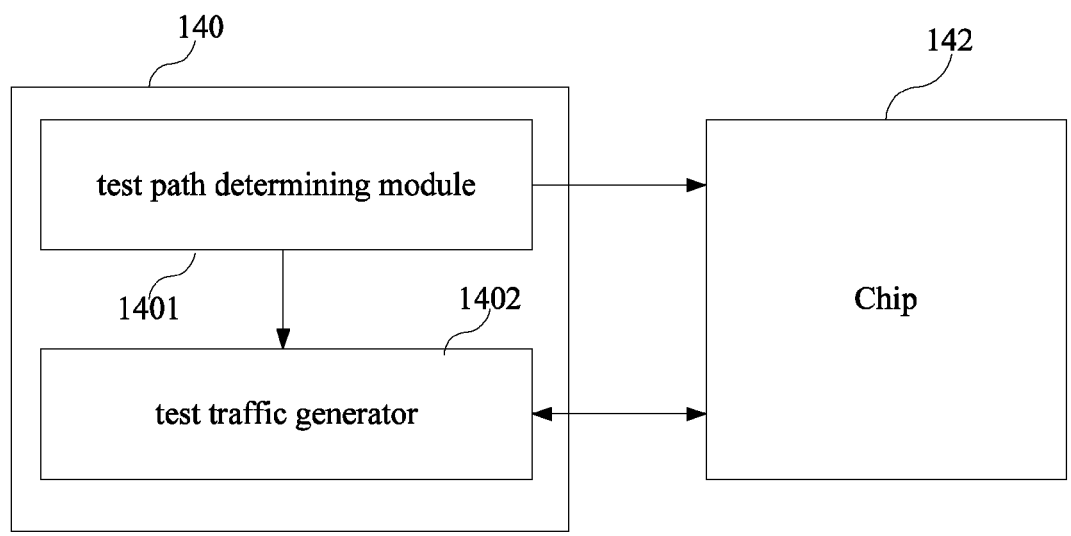
FIG. 15 illustrates a system for testing a chip including multiple ports according to an embodiment of the present invention.

FIG. 15 illustrates a system for testing a chip including multiple ports according to an embodiment of the present invention. As shown, the system 140 includes a test path determining module 1401 and a test traffic generator 1402. The test path determining module 1401 is configured to determine a test path formed by connecting the multiple ports of the chip, in which the test path is determined in a way that an internal logic circuit is bypassed. The test traffic generator 1402 is configured to generate a test traffic, transmit the test traffic to the test path of a chip 142 to be tested, and receive the test traffic from the test path.

In this embodiment, a test path can be determined by the test path determining module 1401 such that the test path bypasses the internal logic circuit of the chip 142.

The internal structure of the chip 142 is similar to the internal structure illustratively described with reference to FIG. 2. The ports at the chip 142 are electrically connected to the test chain of the chip. Further, the test path determining module 1401 sets the working mode for each port to determine the transmission of the test traffic generated by the test traffic generator 1402 in the test path for the chip. Each of the ports at the chip 142 can experience the test traffic upon the work mode is set.

If the chip 142 is provided in a system, the external port is used to connect the system to other system which can be a device or an element and the internal port is used to connect the chip to the other chip(s) of the system, as above discussed. In the following embodiments as to testing a single chip, the ports at the chip are classified into the external port and internal port.

The port through which the test traffic is injected to the chip is an external port and set as a normal mode and the other external port if any can be set as the normal mode or a near end loopback mode, while the internal ports in the chip can be set as the near end loopback mode.

If only the external port through which the test traffic is injected to the chip is set as the normal mode, the test path is determined by the test path determining module 1401 in a way that similar to the determination of the test path discussed with reference to FIG. 11 and FIG. 13. We now will brief that the system 142 is applied to the chip shown with seven ports as described in FIG. 13. In this embodiment, the chip 142 is the chip with seven ports 120, 121, 122, 123, 124, 125, and 126. Any external port of the chip can be used to connect with the test traffic generator 1402 so as to receive the test traffic from and transmits the test traffic to the test traffic generator 1402. In this embodiment, the external port 120 is selected to connect with the test traffic generator 1402. The external port 120, through which the test traffic is injected to the chip, is set as normal mode and the other external port is set as the near end loopback mode. All internal ports at the chip are set as the near end loopback mode. The port 120 transmits the injected test traffic to the port 121 via the test chain of the chip. The port 121 loops the received test traffic back to the test chain. The port 122 next to the port 121 in the test path receives the test traffic from the test chain and then loops it back to the test chain. The port 123 next to the port 122 in the test path receives the test traffic from the test chain and then loops it back to the test chain. The port 124 next to the port 123 in the test path receives the test traffic from the test chain and then loops it back to the test chain. The port 125 next to the port 124 in the test path receives the test traffic from the test chain and then loops it back to the test chain. The port 126 next to the port 125 in the test path receives the test traffic from the test chain and then loops it back to the test chain. The test traffic is then transmitted to the port 120 and then to the test traffic generator 1402.

In another embodiment where the system 140 is used to test a single chip, each external port of the chip except the one through which the test traffic is injected to the chip is electrically connected to a cable outside of the chip. The test path in this embodiment therefore includes the cables outside of the chip, the ports, and the test chain. This embodiment is illustratively described below with reference to FIG. 15 and FIG. 14. According to said another embodiment, each of the external ports of the chip are set as the normal mode and the internal ports are set as near end loopback mode. As shown, the external port 120 transmits the test traffic injected by the test traffic generator 1402 to the test chain. The external port 121 receives the test traffic from the test chain and transmits the test traffic to the respective cable which is outside of the chip. The external port 121 then injects the test traffic received from the respective cable to the test chain. The external ports 122 and 123 do the same to the test traffic as the external port 121, So for the purpose of simplicity, the description for the transmission of the test traffic through the ports 122 and 123 is omitted. The internal ports 124, 125 and 126 receive the test traffic from the test chain, respectively, and then loop the received test traffic back to the test chain, respectively. Finally, the test traffic is transmitted to the external port 120. The external port 120 further transmits the test traffic to the test traffic generator 1402.

Although the method and system for testing a multi-chip system, and the method and system for testing a single chip have been described with respect to particular embodiments hereinbefore, those skilled in the art can understand that various changes and modifications can be effected therein without departing from the scope and spirit of the invention as defined by the appended claims. For example, Flip-flops may be optionally provided in the test path, such as the test chain, in the multi-chip system as described herein to avoid the delay caused by a long test path.

It is noted that the number of the external ports of the chip can be zero, or the number of the internal ports of the chip can be zero. For example, if the chip is provided in a multi-chip system as above described in certain embodiments and it is only connected to the other chip(s) in the same system, then there is no external port in this chip, i.e., the number of external ports in this chip is zero. If the chip itself is used as a system, then all ports of the chip can be external ports.

According to the solutions set forth in the present application, the test path for the multi-chip system or for one chip is formed by bypassing the internal logic circuit of each chip in the multi-chip system. Therefore, the test traffic can be transmitted throughout the test path without entering into the internal logic circuits. Accordingly, the test for the hardware of the multi-chip system or the chip can be independent of the internal logic circuit where the hardware of the multi-chip system or the chip does not include the internal logic circuit.

A chip with multiple ports is also provided according to an embodiment of the present application. The chip includes more than one port. The ports in the chip can be configured to work in one of working modes selected form the normal mode, near end loopback mode, and bypass mode which have been described above when the chip is under test. A multi-chip system which includes two or more than such chips is also provided according to an embodiment of the present application.

Although illustrative embodiments of the invention have been described in detail herein with reference to the accompanying drawings, it is to be understood that the invention is not limited to those particular embodiments, and that various changes and modifications can be effected therein by one skilled in the art without departing from the scope and spirit of the invention as defined by the appended claims.

What is claimed:

1. A method for testing a multi-chip system including multiple ports, the method comprising:
   determining a test path formed by connecting the multiple ports;
   injecting, by a test traffic generator, a test traffic to the test path;

receiving, by the test traffic generator, the test traffic from the test path; wherein:
    the test path is determined in such a way that an internal logic circuit of each chip in the multi-chip system is bypassed;
    the multiple ports are classified as an external port or an internal port; and
    the test path is determined as follows:
        for an external port in the multi-chip system, when the external port is a port through which the test traffic is injected to the multi-chip system, it is set as a normal mode, otherwise it is set as a near end loopback mode;
        for an internal port at a chip of the multi-chip system, when the internal port is an internal port through which the test traffic is first transmitted to the chip, the internal port is set as the normal mode;
        for an internal port at a first chip via which the first chip is connected to a second chip in the multi-chip system:
            when the first chip experiences the test traffic earlier than the second chip, the internal port is set as the normal mode, and
            when the first chip experiences the test traffic later than the second chip and the internal port is not the internal port through which the test traffic is first transmitted to the first chip, the internal port is set as a bypass mode.

2. A method for testing a multi-chip system including multiple ports, the method comprising:
    determining a test path formed by connecting the multiple ports;
    injecting, by a test traffic generator, a test traffic to the test path;
    receiving, by the test traffic generator, the test traffic from the test path;
    wherein:
        the test path is determined in such a way that an internal logic circuit of each chip in the multi-chip system is bypassed;
        the multiple ports are classified as an external port or an internal port; and
        the test path is determined as follows:
            the external port is set as a normal mode;
            for an internal port at a chip of the multi-chip system, when the internal port is an internal port through which the test traffic is first transmitted to the chip, the internal port is set as the normal mode;
            for an internal port at a first chip via which the first chip is connected to a second chip in the multi-chip system:
                when the first chip experiences the test traffic earlier than the second chip, the internal port is set as the normal mode, and
                when the first chip experiences the test traffic later than the second chip and the internal port is not the internal port through which the test traffic is first transmitted to the first chip, the internal port is set as a bypass mode.

3. A multi-chip system comprising:
    a plurality of integrated circuit chips and a plurality of ports, each port of the plurality of ports operable to transmit or receive a signal;
    at least two chips of the plurality of integrated circuit chips comprising:
        at least two ports of the plurality of ports;
        at least one internal logic circuit; and
        a test chain, wherein each of the at least two ports are electrically connected to the test chain;
    at least one chip of the plurality of integrated circuit chips comprising logic operable to determine a test path formed by connecting the multiple ports to the test chain so that the internal logic circuit of each of the at least two chips is bypassed;
    at least one port of the plurality of ports operable to receive test traffic from a test traffic generator and inject the test traffic to the test path;
    at least one port of the plurality of ports operable to receive test traffic from the test path;
    wherein:
        each port of the plurality of ports is classified as an external port or an internal port; and
        the logic of the at least one chip determines the test path as follows:
            for an external port in the multi-chip system, when the external port is a port through which the test traffic is injected to the multi-chip system, it is set as a normal mode, otherwise it is set as a near end loopback mode;
            for an internal port at a chip of the multi-chip system, when the internal port is an internal port through which the test traffic is first transmitted to the chip, the internal port is set as the normal mode;
            for an internal port at a first chip via which the first chip is connected to a second chip in the multi-chip system:
                when the first chip experiences the test traffic earlier than the second chip, the internal port is set as the normal mode, and
                when the first chip experiences the test traffic later than the second chip and the internal port is not the internal port through which the test traffic is first transmitted to the first chip, the internal port is set as a bypass mode.

4. A multi-chip system comprising:
    a plurality of integrated circuit chips and a plurality of ports, each port of the plurality of ports operable to transmit or receive a signal;
    at least two chips of the plurality of integrated circuit chips comprising:
        at least two ports of the plurality of ports;
        at least one internal logic circuit; and
        a test chain, wherein each of the at least two ports are electrically connected to the test chain;
    at least one chip of the plurality of integrated circuit chips comprising logic operable to determine a test path formed by connecting the multiple ports to the test chain so that the internal logic circuit of each of the at least two chips is bypassed;
    at least one port of the plurality of ports operable to receive test traffic from a test traffic generator and inject the test traffic to the test path;
    at least one port of the plurality of ports operable to receive test traffic from the test path;
    wherein:
        each port of the plurality of ports is classified as an external port or an internal port; and
        the logic of the at least one chip determines the test path as follows:
            the external port is set as a normal mode;
            for an internal port at a chip of the multi-chip system, when the internal port is an internal port through which the test traffic is first transmitted to the chip, the internal port is set as the normal mode;

for an internal port at a first chip via which the first chip is connected to a second chip in the multi-chip system:
  when the first chip experiences the test traffic earlier than the second chip, the internal port is set as the normal mode, and
  when the first chip experiences the test traffic later than the second chip and the internal port is not the internal port through which the test traffic is first transmitted to the first chip, the internal port is set as a bypass mode.

\* \* \* \* \*